(12) United States Patent
Kurahashi et al.

(10) Patent No.: US 7,541,621 B2
(45) Date of Patent: Jun. 2, 2009

(54) SEMICONDUCTOR LIGHT EMITTING DEVICE HAVING A CURRENT NARROWING PORTION AND MANUFACTURING METHOD FOR SEMICONDUCTOR LIGHT EMITTING DEVICE

(75) Inventors: Takahisa Kurahashi, Kashiba (JP);
Tetsurou Murakami, Tenri (JP);
Shouichi Ooyama, Kyoto-fu (JP);
Osamu Yamamoto, Nara (JP)

(73) Assignee: Sharp Kabushiki Kaisha, Osaka (JP)

( * ) Notice: Subject to any disclaimer, the term of this patent is extended or adjusted under 35 U.S.C. 154(b) by 382 days.

(21) Appl. No.: 11/207,794

(22) Filed: Aug. 22, 2005

(65) Prior Publication Data
US 2006/0043392 A1 Mar. 2, 2006

(30) Foreign Application Priority Data
Aug. 25, 2004 (JP) ............................. 2004-245492

(51) Int. Cl.
*H01L 33/00* (2006.01)
(52) U.S. Cl. .................... 257/94; 257/79; 257/E33.006
(58) Field of Classification Search .................. 257/79, 257/94, E33.006
See application file for complete search history.

(56) References Cited

U.S. PATENT DOCUMENTS

| 5,376,580 A | 12/1994 | Kish et al. |
| 5,502,316 A | 3/1996 | Kish et al. |
| 2002/0000563 A1* | 1/2002 | Udagawa ..................... 257/94 |
| 2003/0062534 A1* | 4/2003 | Hata et al. ..................... 257/99 |
| 2003/0111667 A1* | 6/2003 | Schubert ....................... 257/98 |
| 2003/0218172 A1 | 11/2003 | Sugawara et al. |
| 2004/0115845 A1* | 6/2004 | Pan et al. ..................... 438/22 |
| 2005/0017250 A1* | 1/2005 | Nitta et al. ..................... 257/79 |
| 2005/0023543 A1* | 2/2005 | Konno .......................... 257/94 |
| 2005/0035355 A1 | 2/2005 | Konno et al. |

FOREIGN PATENT DOCUMENTS

| CN | 1450667 A | 10/2003 |
| EP | 0 405 757 | 1/1991 |
| JP | 61-078176 | 4/1986 |
| JP | 03-035568 | 2/1991 |
| JP | 6-302857 | 10/1994 |

(Continued)

OTHER PUBLICATIONS

Guest Paper, Nikkei Electronics by Nikkei Business Publications, Inc., Oct. 21, 2002, pp. 123-132.

*Primary Examiner*—Thomas L Dickey
(74) *Attorney, Agent, or Firm*—Nixon & Vanderhye, PC

(57) ABSTRACT

A semiconductor light emitting device includes a first conductivity-type first semiconductor layer; an emission layer; a second conductivity-type second semiconductor layer; and a second conductivity-type transparent substrate transparent to light beams from the emission layer and directly bonded to the second semiconductor layer. The transparent substrate has a parallel surface almost parallel to the emission layer on an opposite side of the emission layer, and an inclined surface adjoining the parallel surface and inclined to the parallel surface. Light beams totally reflected on the parallel surface and light beams totally reflected on a side surface of the transparent substrate come incident to the inclined surface at an angle smaller than the critical angle, and emit out of the semiconductor light emitting device.

7 Claims, 8 Drawing Sheets

FOREIGN PATENT DOCUMENTS

| | | |
|---|---|---|
| JP | 07-302930 | 11/1995 |
| JP | 08-111544 | 4/1996 |
| JP | 09-237916 | 9/1997 |
| JP | 11-186613 | 7/1999 |
| JP | 2001-144322 | 5/2001 |
| JP | 3230638 | 9/2001 |
| JP | 3239061 | 10/2001 |
| JP | 2003-298108 | 10/2003 |
| JP | 3507716 | 12/2003 |
| JP | 2005-026395 | 1/2005 |

\* cited by examiner

SEMICONDUCTOR LIGHT EMITTING DEVICE HAVING A CURRENT NARROWING PORTION AND MANUFACTURING METHOD FOR SEMICONDUCTOR LIGHT EMITTING DEVICE

CROSS-REFERENCE TO RELATED APPLICATION

This nonprovisional application claims priority under 35 U.S.C. §119(a) on Patent Application No. 2004-245492 filed in Japan on Aug. 25, 2004, the entire contents of which are hereby incorporated by reference.

BACKGROUND OF THE INVENTION

The present invention relates to a semiconductor light emitting device for use in optical communication equipment, information display panels, CCD (Charge Coupled Device) camera auxiliary light sources, LCD (Liquid Crystal Display) backlights, lighting equipment and the like.

In recent years, LEDs (Light Emitting Diodes) are widely used in optical communication equipment, information display panels, CCD camera auxiliary light sources, LCD backlights, lighting equipment and the like. High luminance is important for the LEDs for use in these applications. Particularly in these days, use of the LEDs as lighting equipment has started, which increases the needs for high luminance. One method for achieving high luminance is to enhance efficiency of LEDs. The efficiency of the LEDs is determined by internal quantum efficiency and external emitting efficiency, among which the external emitting efficiency is largely influenced by device structure.

One example of the method for enhancing the external emitting efficiency of the LED is to use substrates transparent against emitting wavelength. In the case of AlGaInP (aluminum gallium indium phosphide)-based LED, conventional manufacturing methods for the LED having a substrate transparent to emission wavelength include one shown in FIGS. 9A, 9B, 9C and 9D (see, e.g., JP H06-302857 A). In this manufacturing method for LED, on a GaAs (gallium arsenide) substrate 101 opaque to emission wavelength, an AlGaInP-based emission layer 102 is epitaxially grown, and a GaP current diffusion layer 103 is grown thereon for several dozen μm thickness (see FIG. 9A). Next, the GaAs substrate 101 opaque to emission wavelength is removed (see FIG. 9B), and the GaP substrate 105 is joined to the removed face by heat treatment (see FIG. 9C). As shown in FIG. 9D, a substrate-side electrode 106 and a top-side electrode 107 are formed.

In the manufacturing method for the LED, the AlGaInP-based emission layer 102 is not matched to GaP, and therefore once the emission layer 102 is grown on the GaAs substrate 101, the GaAs substrate 101 is removed and the GaP substrate is attached thereto. The GaP current diffusion layer 103 grown on the emission layer 102 is set to have a size of 50 to 100 μm in view of a growth time and a mechanical strength of wafers after removal of the GaAs substrate 101. If the layer thickness of the GaP current diffusion layer 103 is 40 μm or less, the wafer is extremely fragile during handling, whereas if the layer thickness is 100 μm or more, the growth time is prolonged and the cost of the LED becomes high.

However, even if the layer thickness of the GaP current diffusion layer 103 is set at 50 to 100 μm, the mechanical strength is still not enough and the problem that wafers break during handling is not yet solved.

Accordingly, in order to solve the problem, there is another manufacturing method for AlGaInP-based LED (see JP Patent No. 3230638) as shown in FIGS. 10A, 10B, 10C and 10D. In this LED manufacturing method, on a GaAs substrate 111 opaque to emission wavelength, an AlGaInP-based emission layer 112 is epitaxially grown, and a GaP layer 113 is formed thereon (see FIG. 10A). Then, on the GaP layer 113, a GaP substrate 115 transparent to emission wavelength is placed, and heat treatment is applied thereto for establishing joint (see FIG. 10B). Then, the GaAs substrate 111 opaque to emission wavelength is removed (see FIG. 10C). As shown in FIG. 10D, a substrate-side electrode 116 and a top-side electrode 117 are formed.

In this LED manufacturing method, it is not necessary to handle wafers with a thickness of 50 to 100 μm, and therefore the problem that the wafers break during manufacturing process can be solved.

Another method for achieving high luminance in the LED is to increase a current injected into the LED.

Problems arising from increase in a current injected into the LED include heat saturation caused by heat generation in the emission layer. With increase of the injection current, a heat quantity generated in the emission layer exceeds a heat quantity radiated outside mainly through a die bonding portion, which increases a temperature of the emission layer, resulting in overflow of carriers and saturation of optical output.

In order to solve the problem, an AlGaInP-based LED as shown in FIG. 11 has conventionally been proposed (see Nikkei Electronics by Nikkei Business Publications, Inc., Oct. 21, 2002). In this LED, an Si (silicon) substrate 121 with thermal conductivity three times higher than conventionally-used GaAs substrates is attached to a semiconductor layer 123, which is connected to an emission layer 124, through a metal layer 122. In this LED, the emission layer 124 is epitaxially grown on the GaAs substrate, and after the Si substrate 121 is attached thereto, the GaAs substrate is removed. In FIG. 11, there are shown a substrate-side electrode 126, a top-side electrode 127 and a current block layer 128.

The LED is free from large heat resistance from the GaAs substrate, which makes it possible to considerably reduce a loss of heat radiation.

However, the conventional LEDs shown in FIGS. 9D, 10D and 11 suffer the problem that luminance is degraded due to other causes.

More particularly, AlGaInP-based semiconductors have a refraction index of about 3 to 3.5, whereas air has a refraction index of 1 and resin has a refraction index of about 1.5. Therefore, there are differences in refraction index of 2 to 2.5 and 1.5 to 2 between air and an AlGaInP-based semiconductor layer, and between resin and the AlGaInP-based semiconductor layer, respectively. With the differences in refraction index, among light beams generated in the chip, the light beams incident to the surface of an LED chip at angles not less than a critical angle are totally reflected. The critical angle is approx. 17° in the case where light beams come incident from the AlGaInP-based semiconductor layer to air, while the critical angle is approx. 25° in the case where light beams come incident from the AlGaInP-based semiconductor layer to resin.

Therefore, in the conventional LEDs shown in FIGS. 9D and 10D in which the GaP substrates 105, 115 are joined to the GaP layer 113 or the emission layer 102, the chips are in an almost rectangular parallelopiped shape, and so a proportion of light beams totally reflected on the chip surface to light beams generated in an active layer is relatively high. The totally reflected light beam is, as schematically shown in FIG.

12, multiple-reflected in the chip, passes an active layer 131 a plurality of times, and is reflected by a plurality of electrodes 132. In this case, the multiple-reflected light beam is absorbed by the active layer 131 and the electrodes 132. In FIG. 12, the positions at which the multiple-reflected light beam is absorbed by the active layer 131 and the electrodes 132 are shown by symbol A. Thus, as a result of absorption of the light beam at a plurality of positions, the luminance of the LED is degraded.

Moreover, in the conventional LED with the Si substrate 121 attached thereto in FIG. 11, the semiconductor layer 123 transparent to emitting light, the emission layer 124 and the semiconductor layer 125 are relatively thin with respect to the entire LED, which makes the proportion of multiple-reflected light beams larger than that in the LEDs in FIGS. 9D and 10D. Therefore, the number of times that a light beam generated in the active layer passes the active layer and the number of times that the light beam is reflected by the electrodes further increase, which in turn increases the absorbed quantity in the active layer and the electrodes and causes large degradation in luminance of the LEDs.

SUMMARY OF THE INVENTION

An object of the present invention is to provide a semiconductor light emitting device capable of preventing degradation of luminance attributed to light absorption.

In order to achieve the above object, the present invention provides a semiconductor light emitting device comprising:

a first conductivity-type first semiconductor layer; an emission layer; a second conductivity-type second semiconductor layer; and a second conductivity-type transparent substrate transparent to light beams from the emission layer and directly bonded to the second semiconductor layer which are formed in this order; wherein the transparent substrate has a parallel surface almost parallel to the emission layer on an opposite side of the emission layer, and an inclined surface adjoining the parallel surface and inclined to the parallel surface.

According to the above configuration, among light beams generated in the emission layer, the light beams coming incident to a reflection surface in the semiconductor light emitting device at angles not less than a critical angle are totally reflected and travel in the semiconductor light emitting device. Herein, the transparent substrate has a parallel surface almost parallel to the emission layer, and an inclined surface inclined to the parallel surface. For example, light beams totally reflected on the parallel surface and light beams totally reflected on a side surface of the transparent substrate come incident to the inclined surface at an angle smaller than the critical angle, and emit out of the semiconductor light emitting device. Therefore, a quantity of multiple-reflected lights which keep on being totally reflected within the semiconductor light emitting device becomes smaller than that in the conventional case. As a result, a light quantity outgoing from the semiconductor light emitting device to the outside becomes larger than the conventional light quantity, and a luminance of the semiconductor light emitting device increases.

In one embodiment, an edge between the inclined surface and the parallel surface is at a distance not less than 20 µm from a side surface of the transparent substrate toward inside in plan view, and an edge between the inclined surface and the side surface of the transparent substrate is at a distance not less than 20 µm from the parallel surface of the transparent substrate toward the emission layer in side view.

According to the embodiment, light beams generated in the emission layer can be effectively emitted out of the semiconductor light emitting device from the reflection surface of the transparent substrate. Therefore, an external quantum efficiency of the semiconductor light emitting device is enhanced.

In the embodiment, an edge between the inclined surface and the parallel surface is preferably at a distance not less than 20 µm and not more than 200 µm from a side surface of the transparent substrate toward inside in plan view, and an edge between the inclined surface and the side surface of the transparent substrate is preferably at a distance not less than 20 µm and not more than 200 µm from the parallel surface of the transparent substrate toward the emission layer in side view.

In one embodiment, the emission layer has at least one layer formed of $(Al_yGa_{1-y})_zIn_{1-z}P(0 \leq y \leq 1, 0 < z < 1)$.

According to the embodiment, the emission layer can produce light beams in the wavelength range corresponding to green color to red color, and the semiconductor light emitting device which can emit light beams in this wavelength range at a high luminance can be provided.

In one embodiment, the semiconductor light emitting device further comprises a first electrode to which a probe is connectable on a surface of the first semiconductor layer opposite to the emission layer.

According to the embodiment, in a manufacturing process of the semiconductor light emitting device, a probe is connected to the first electrode and inspections can be conducted easily.

In one embodiment, the first electrode is circular shaped and has a diameter of not less than 80 µm.

According to the embodiment, power is easily supplied to the first electrode and inspections can be easily conducted.

In the embodiment, the first electrode preferably has a diameter of not less than 80 µm and not more than 150 µm.

In one embodiment, the first electrode is in non-ohmic contact with the first semiconductor layer, and the semiconductor light emitting device further comprises a second electrode which is positioned around the first electrode on a surface of the first semiconductor layer, and which is electrically connected to the first electrode and is in ohmic contact with the first semiconductor layer.

According to the embodiment, the first electrode is in non-ohmic contact with the first semiconductor layer, which eliminates the necessity of providing an alloy layer, a contact layer having a relatively heavy dopant concentration or other layers in between the first semiconductor layer and the first electrode. Therefore, with respect to the first electrode, it becomes possible to prevent light absorption in the alloy layer, the contact layer or other layers, which allows increase in light emission luminance of the semiconductor light emitting device.

Moreover, the second electrode, although in ohmic contact with the first semiconductor layer, is positioned around the first electrode, and therefore in the case where the central portion of the emission layer in plan view is a light emitting region for example, the absorbed quantity of light can be reduced. Further, since the second electrode is connected to the first electrode, power supply can be implemented with relatively low impedance through the second electrode.

In one embodiment, the second electrode has a branch shape in plan view.

According to the embodiment, current can be effectively injected into the emission layer.

In one embodiment, the first electrode includes a reflection layer having a reflectance of not less than 90% and not more than 100% to light beams produced in the emission layer, and the reflection layer is in contact with the first semiconductor layer.

According to the embodiment, 90% or more light quantity of light beams produced in the emission layer and coming incident to the reflection layer are reflected. Therefore, light absorption in the reflection layer is effectively prevented, which makes it possible to effectively prevent reduction in light quantity of the semiconductor light emitting device and to increase the luminance effectively.

In one embodiment, the reflection layer contains at least Al, Ag or Au.

According to the embodiment, the reflection layer in contact with the first semiconductor layer may be formed easily.

In one embodiment, the semiconductor light emitting device further comprises a current narrowing portion for defining a light emitting region in the emission layer at a position almost identical to the first electrode in plan view.

According to the embodiment, with the current narrowing portion, a light emitting region is defined in the emission layer at a position almost identical to the first electrode, so that the light beams produced in the light emitting region are emitted effectively from the parallel surface and the inclined surface of the transparent substrate. Therefore, a relatively large proportion of light beams produced in the light emitting region in the emission layer are emitted out from the semiconductor light emitting device, which increases the luminance of the semiconductor light emitting device.

Further, according to another aspect of the present invention, there is provided a manufacturing method for semiconductor light emitting device comprising the steps of:

forming a first conductivity-type first semiconductor layer;
forming an emission layer on the first semiconductor layer;
forming a second conductivity-type second semiconductor layer on the emission layer;
directly bonding a second conductivity-type transparent substrate, which is transparent to light beams from the emission layer, to a surface of the second semiconductor layer;
forming a first groove having a V-shaped cross section on a surface of the transparent substrate;
forming a second groove extending from the first semiconductor layer to at least the emission layer at a position almost identical to a bottom of the first groove in plan view;
forming a first electrode on a surface of the first semiconductor layer opposite to the emission layer; and
supplying power to the first electrode to conduct an inspection.

According to the above configuration, a first conductivity-type first semiconductor layer is formed, an emission layer is formed on the first semiconductor layer, and a second conductivity-type second semiconductor layer is formed on the emission layer. A transparent substrate is joined to the surface of the second semiconductor layer. A first groove with a V-shaped cross section is formed on the surface of the transparent substrate. The V-shaped first groove makes an inclined surface adjoining a parallel surface almost parallel to the emission layer of the transparent substrate when a wafer containing the first semiconductor layer, the emission layer, the second semiconductor layer and the transparent substrate is diced in chips. A second groove extending from the first semiconductor layer to at least the emission layer is formed at a position almost identical to a bottom of the first groove in plan view. A first electrode is formed on the surface of the first semiconductor layer opposite to the emission layer. Power is supplied to the first layer and inspections are conducted. By the second groove, at least the emission layer is divided into respective semiconductor light emitting devices to be, which makes it possible to perform inspections on the first semiconductor layer, the emission layer, the second semiconductor layer and the transparent substrate in the state of a wafer before being diced into chips. Therefore, compared to performing inspections for every chip of semiconductor light emitting device, effective inspections may be conducted with less trouble. As a result, the manufacturing efficiency of the semiconductor light emitting device is enhanced.

In the semiconductor light emitting device and the manufacturing method for semiconductor light emitting device of the invention, the first conductivity-type may be one of p-type and n-type and the second conductivity-type may be the other of the p-type and n-type.

BRIEF DESCRIPTION OF THE DRAWINGS

The present invention will become more fully understood from the detailed description given hereinbelow and the accompanying drawings which are given by way of illustration only, and thus are not limitative of the present invention, and wherein.

DETAILED DESCRIPTION OF THE INVENTION

Figure 1A:
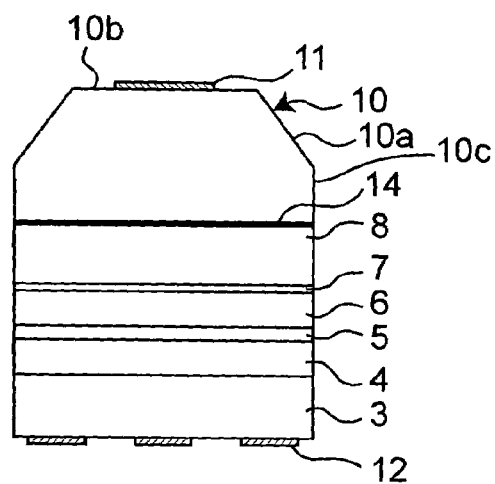
FIG. 1A is a cross sectional view for showing an LED in the first embodiment.

Hereinbelow, the present invention will be described in detail on the basis of the embodiments shown in the drawings.

THE REFERENCE EXAMPLE

Figure 1B:
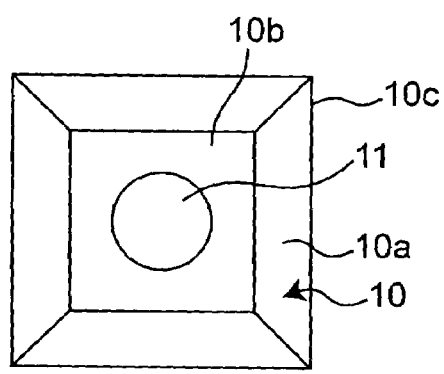
FIG. 1B is a plan view for showing the LED in the first embodiment.
Figure 1C:
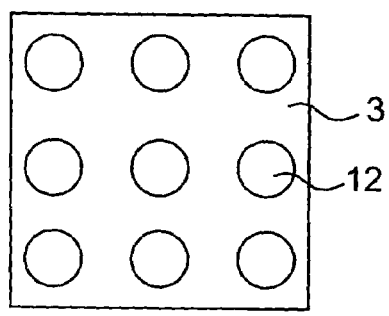
FIG. 1C is a bottom view showing the LED in the first embodiment.

FIGS. 1A, 1B and 1C are a cross sectional view, a plan view and a bottom view respectively for showing an LED as a semiconductor light emitting device in the reference example of the present invention.

The LED is composed of an n-type $Al_{0.5}Ga_{0.5}As$ current diffusion region 3 as the first conductivity-type first semiconductor layer, an n-type $Al_{0.5}In_{0.5}P$ cladding layer 4, a quantum well active layer 5 as the emission layer composed of an $(Al_{0.5}Ga_{0.5})_{0.5}In_{0.5}P$ barrier layer and a GaInP well layer, a p-type $Al_{0.5}In_{0.5}P$ cladding layer 6, a p-type $(Al_{0.2}Ga_{0.8})_{0.77}In_{0.23}P$ intermediate layer 7, a p-type $Ga_{0.915}In_{0.085}P$ adhesive contact layer 8 as the second conductivity-type second semiconductor layer, and a p-type GaP substrate 10 as the second conductivity-type transparent substrate. On the p-type GaP substrate 10, a bonding pad 11 made of AuBe/Mo/Au is formed, and on the lower face of the current diffusion layer 3, nine n-type electrodes 12 made of AuSi are formed. The LED is formed to be die-bonded through the n-type electrodes 12.

The GaP substrate 10 has four inclined surfaces 10a on the opposite side of the quantum well active layer 5. The inclined surfaces 10a are adjoining a parallel surface 10b almost parallel to the quantum well active layer 5 and are inclined to the parallel surface 10b at an angle of approx. 130°. The parallel surface 10b is a surface on which the bonding pad 11 is formed. An edge between the inclined surface 10a and the parallel surface 10b is formed at the distance 50 μm from a side surface 10c of the GaP substrate 10 toward the inside in plan view. Moreover, an edge between the inclined surface 10a and the side surface 10c is formed at the distance 60 μm from the parallel surface 10b toward the quantum well active layer 5 in side view.

The LED is manufactured as shown below.

Figure 2:
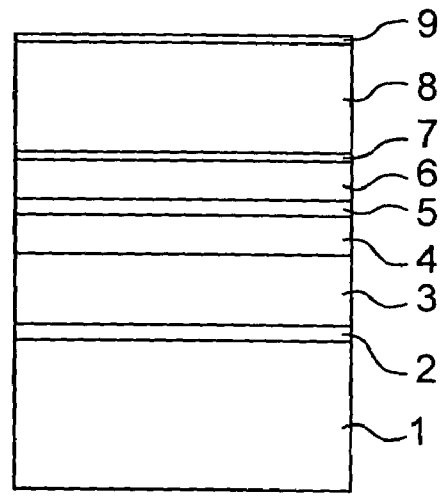
FIG. 2 is a view for showing one step in a manufacturing process of the LED in the first embodiment.

First, as shown in FIG. 2, an n-type GaAs buffer layer 2 with a layer thickness of 1 μm, an n-type $Al_{0.5}Ga_{0.5}As$ current diffusion region 3 with a layer thickness of 3 μm, an n-type $Al_{0.5}In_{0.5}P$ cladding layer 4 with a layer thickness of 1 μm, a quantum well active layer 5 composed of an $(Al_{0.5}Ga_{0.5})_{0.5}In_{0.5}P$ barrier layer and a GaInP well layer, a p-type $Al_{0.5}In_{0.5}P$ cladding layer 6 with a layer thickness of 1 μm, a p-type $(Al_{0.2}Ga_{0.8})_{0.77}In_{0.23}P$ intermediate layer 7 with a layer thickness of 0.15 μm, a p-type $Ga_{0.915}In_{0.085}P$ adhesive contact layer 8 with a layer thickness of 5 μm, and a non-doped GaAs cap layer 9 with a layer thickness of 0.01 μm are stacked on the n-type GaAs substrate 1 by MOCVD (Metal-Organic Chemical Vapor Deposition) method. Applicable growth methods other than the MOCVD method include MBE (Molecular Beam Epitaxy) method and MOMBE (Metal Organic Molecular Beam Epitaxy) method.

During growth of each layer, Zn is used as a p-type dopant while Si is used as an n-type dopant.

The carrier concentration of the p-type $Ga_{0.915}In_{0.085}P$ adhesive contact layer 8 is set at $2.5 \times 10^{18}$ $cm^{-3}$.

Figure 3:
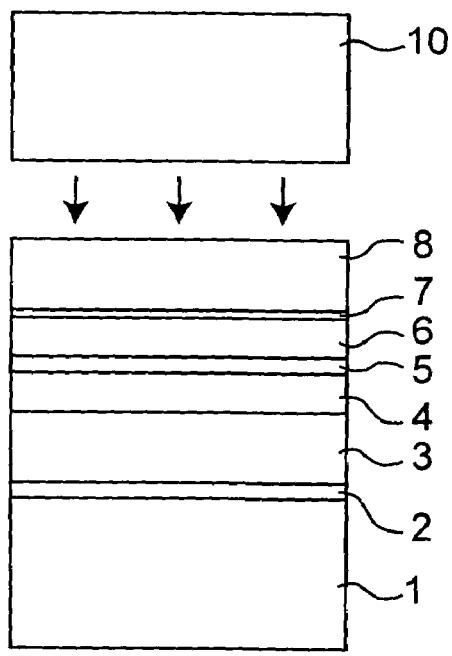
FIG. 3 is a view for showing a state that a p-type GaP substrate is joined to an adhesive contact layer.

After that, as shown in FIG. 3, the non-doped GaAs cap layer 9 is removed and the p-type $Ga_{0.915}In_{0.085}P$ adhesive contact layer 8 is polished to put the surface in a mirror-smooth state, and then, the surface is treated with an etchant to remove an oxide. Moreover, a p-type GaP substrate 10 with a mirror surface is prepared, and the surface is treated with an etchant to remove an oxide. Then, after cleaning and drying are performed, the GaP substrate 10 is brought into cohesive contact with the adhesive contact layer 8 in a pressed state, and is subjected to heat treatment in vacuo at 750° C. for 0.5 hour. With this, the GaP substrate 10 is joined to the adhesive contact layer 8. The heat treatment may be conducted in hydrogen atmosphere.

Figure 4:
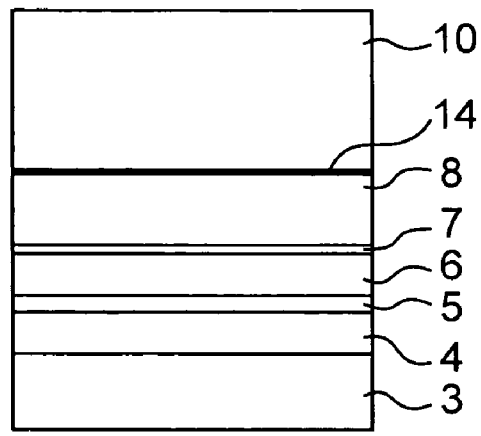
FIG. 4 is a view for showing a state that an n-type GaAs substrate and an n-type GaAs buffer layer are removed.

After that, as shown in FIG. 4, with an ammonium/hydrogen peroxide-based etchant, the n-type GaAs substrate 1 and the n-type GaAs buffer layer 2 are etched away. Then, the upper surface of the p-type GaP substrate 10 is polished and the p-type GaP substrate 10 is given a thickness of 280 μm. On the polished surface of the p-type GaP substrate 10, a bonding pad 11 made of AuBe/Mo/Au with a diameter of 100 μm is formed with a pitch of 300 μm. Moreover, on the surface of the n-type $Al_{0.5}Ga_{0.5}As$ current diffusion region 3, circular-shaped n-type electrodes 12 made of AuSi with a diameter of 40 μm are formed. The n-type electrodes 12 are formed so that 9 units are disposed on one LED chip.

Then, on the surface of the p-type GaP substrate 10, with a cross-sectionally V-shaped blade with a head angle of 80°, a cross-sectionally V-shaped groove having a depth of 70 μm is formed.

The surface forming the V-shaped groove makes the inclined surface 10a of the p-type GaP substrate.

Further, with a plate blade with a thickness of 20 μm, a groove extending from the bottom of the V-shaped groove to the vicinity of the lower end of the current diffusion layer 3 is formed and diced. Then, damaged layers by dicing are removed by etching and broken into chips.

Figure 5:
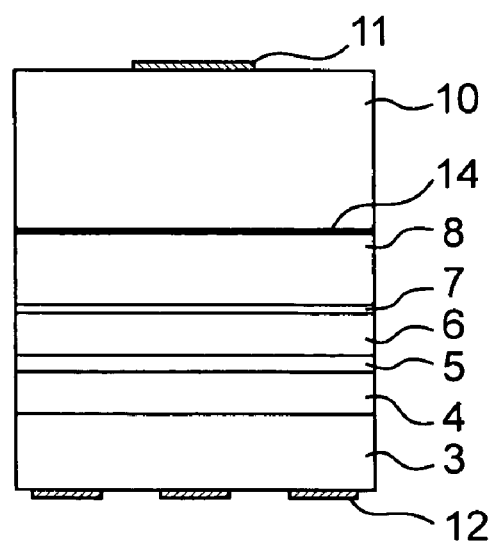
FIG. 5 is a view showing an LED of a comparative example.

Thus-obtained semiconductor device had an external quantum efficiency of 18%, which was approx. 1.3 times larger than the external quantum efficiency of 14% in an LED of a comparative example whose p-type GaP substrate 10 had no inclined surface as shown in FIG. 5. It is to be noted that the LED in FIG. 5 has component members similar to those of the LED in FIG. 1A except that the inclined surface is not formed on the p-type GaP substrate 10.

This indicates that the inclined surfaces 10a on the p-type GaP substrate decrease light beams which are multiple-reflected inside the chip.

In the present embodiment, a shortest distance between the edge of the bonding pad 11 and the edge of the inclined surface 10a is about 40 μm. Moreover, an edge between the inclined surface 10a and the parallel surface 10b is formed at a position 50 μm away from the side surface 10c of the p-type GaP substrate toward the inside in plan view. The inclined surface 10a is formed with various sizes at various positions in conformity with the size of the chip and the bonding pad 11. The edge between the inclined surface 10a and the parallel surface 10b should be formed at a distance not less than 20 μm away from the side surface 10c toward the inside and not farther than the edge of the bonding pad 11 in plan view. Moreover, the edge between the inclined surface 10a and the side surface 10c should be formed at a distance not less than 20 μm away from the parallel surface 10b to the quantum well active layer 5 in side view. The inclined surface 10a formed with such sizes and at such positions can bring about an effect to enhance the external quantum efficiency of the LED. In the case where the edge between the inclined surface 10a and the parallel surface 10b was formed at a position 20 μm away from the side surface 10c toward the inside in plan view, and the edge between the inclined surface 10a and the side surface 10c was formed at a position 20 μm away from the parallel surface 10b to the quantum well active layer 5 in side view, the external quantum efficiency was approx. 1.1 larger than the external quantum efficiency of the LED in FIG. 5.

Figure 11:
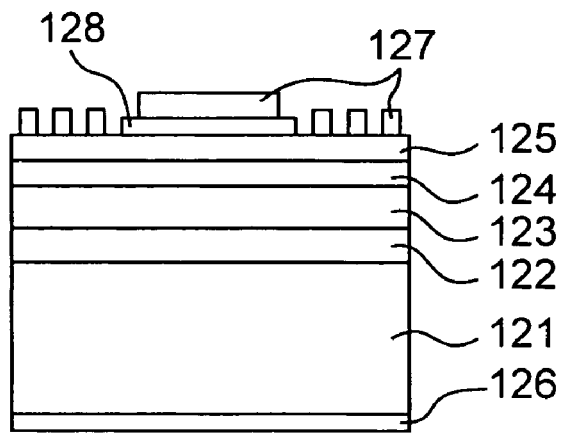
FIG. 11 is a cross sectional view for showing a conventional AlGaInP-based LED.
Figure 12:
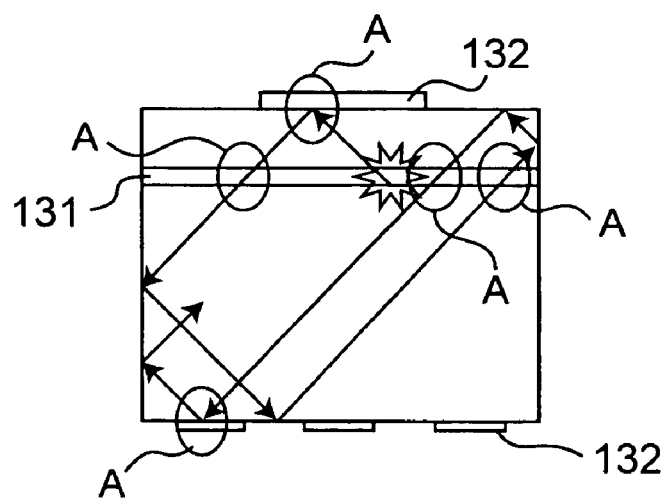
FIG. 12 is a schematic view for showing the state of multiple-reflection in a conventional LED.

As for the current-optical output characteristics, in the case of the conventional LED in which the transparent substrate 121 is die-bonded as shown in FIG. 11, when pulse driving with 3% duty ratio was conducted in 1 sec. periods, heat saturation occurred at about 200 mA. In the case of the LED of the present embodiment, when pulse driving was conducted under the same conditions, heat saturation did not occur until the current reached 800 mA. It is considered that the quantum well active layer 5 that is the emission layer is closer to the die bonding surface in the present invention, which considerably enhances heat radiation characteristics.

Although in the present embodiment, the quantum well active layer 5 was made from AlGaInP-based materials, the materials and types of the emission layer are not limited thereto, and so the quantum well active layer 5 may be made from materials other than AlGaAs-based materials and my be made up of a single layer.

Moreover, although the GaP substrate 10 was used as the transparent substrate, the transparent substrate is not limited thereto. Other semiconductor substrates made from such materials as GaN and SiC may be used as long as the substrates are transparent to light beams produced in the emission layer. Further, insulative substrates made from materials such as sapphire and glass may also be used. In this case, both p-type and n-type electrodes should be formed on the semiconductor layer that is subject to die bonding, and the electrodes should be die-bonded with bump. The layer joined to the transparent substrate may be other than the contact layer, e.g., a cladding layer.

EXEMPLARY EMBODIMENT

Figure 6A:
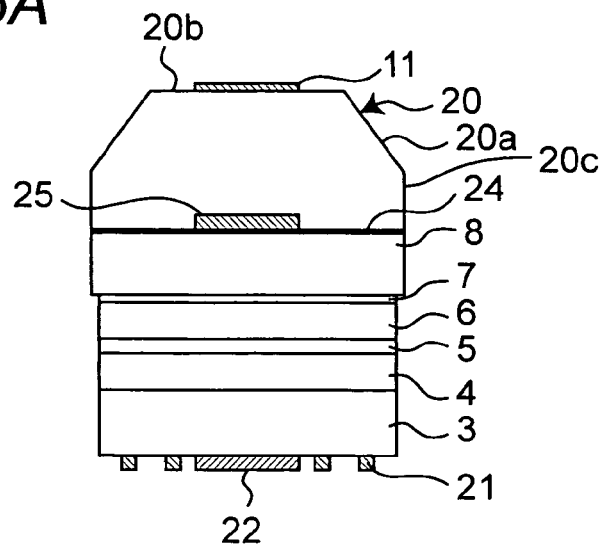
FIG. 6A is a cross sectional view for showing an LED in the second embodiment.
Figure 6B:
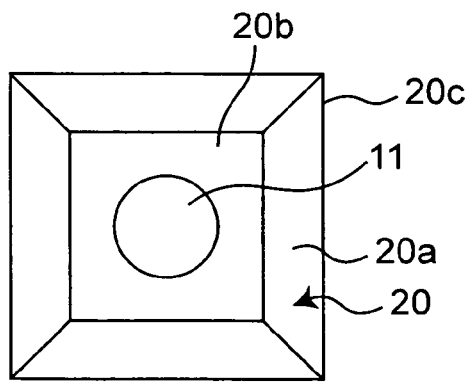
FIG. 6B is a plan view for showing the LED in the second embodiment.
Figure 6C:
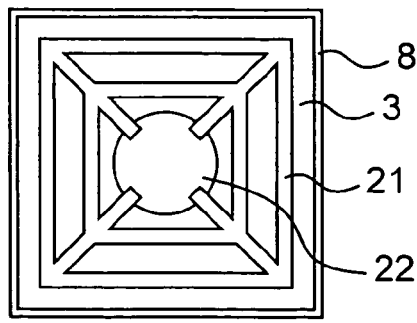
FIG. 6C is a bottom view showing the LED in the second embodiment.

FIGS. 6A, 6B and 6C are a cross sectional view, a plan view and a bottom view respectively for showing an LED in an exemplary embodiment of the present invention.

The LED is composed of an n-type $Al_{0.5}Ga_{0.5}As$ current diffusion region 3 as the first semiconductor layer, an n-type $Al_{0.5}In_{0.5}P$ cladding layer 4, a quantum well active layer 5 as the emission layer composed of an $(Al_{0.5}Ga_{0.5})_{0.5}In_{0.5}P$ barrier layer and a GaInP well layer, a p-type $Al_{0.5}In_{0.5}P$ cladding layer 6, a p-type $(Al_{0.2}Ga_{0.8})_{0.77}In_{0.23}P$ intermediate layer 7, a p-type $Ga_{0.915}In_{0.085}P$ adhesive contact layer 8 as the second semiconductor layer, and a p-type GaP substrate 20 as the transparent substrate.

On the p-type GaP substrate 20, a bonding pad 11 made of AuBe/Mo/Au is formed. Moreover, in a boundary portion between the p-type GaP substrate 20 and the adhesive contact layer 8, a Zn diffusion portion 25 as the current narrowing portion is formed. On the side of the p-type GaP substrate 20 opposite to the quantum well active layer 5, a parallel surface 20b almost parallel to the quantum well active layer 5 and inclined surfaces 20a inclined to the parallel surface 20b are provided.

On the lower surface of the current diffusion layer 3, a circular-shaped Al electrode 22 is disposed. The bonding pad 11, the Zn diffusion portion 25 and the Al electrode 22 are formed of the same size and are formed at almost the same positions in plan view. Moreover, a branch-shaped n-type electrode 21 connected to the Al electrode 22 and surrounding the Al electrode 22 is mounted on the lower surface of the current diffusion layer 3. The LED is die-bonded on the surface on which the n-type electrode 21 and the Al electrode 22 are formed.

The LED of the present embodiment is manufactured as shown below.

First, as with the case of the LED in the first embodiment, the following respective layers are stacked by MOCVD method or the like. More particularly, like in FIG. 2, an n-type GaAs buffer layer 2 with a layer thickness of 1 μm, an n-type $Al_{0.5}Ga_{0.5}As$ current diffusion region 3 with a layer thickness of 3 μm, an n-type $Al_{0.5}In_{0.5}P$ cladding layer 4 with a layer thickness of 1 μm, a quantum well active layer 5 composed of an $(Al_{0.5}Ga_{0.5})_{0.5}In_{0.5}P$ barrier layer and a GaInP well layer, a p-type $Al_{0.5}In_{0.5}P$ cladding layer 6 with a layer thickness of 1 μm, a p-type $(Al_{0.2}Ga_{0.8})_{0.77}In_{0.23}P$ intermediate layer 7 with a layer thickness of 0.15 μm, a p-type $Ga_{0.915}In_{0.085}P$ adhesive contact layer 8 with a layer thickness of 5 μm, and a non-doped GaAs cap layer 9 with a layer thickness of 0.01 μm are stacked on the n-type GaAs substrate 1. Various growth methods other than the MOCVD method including MBE method and MOMBE method are applicable.

In this case, Zn is used as a p-type dopant while Si is used as an n-type dopant.

The carrier concentration of the p-type $Ga_{0.915}In_{0.085}P$ adhesive contact layer 8 is set at $5 \times 10^{17}$ cm$^{-3}$.

Figure 7:
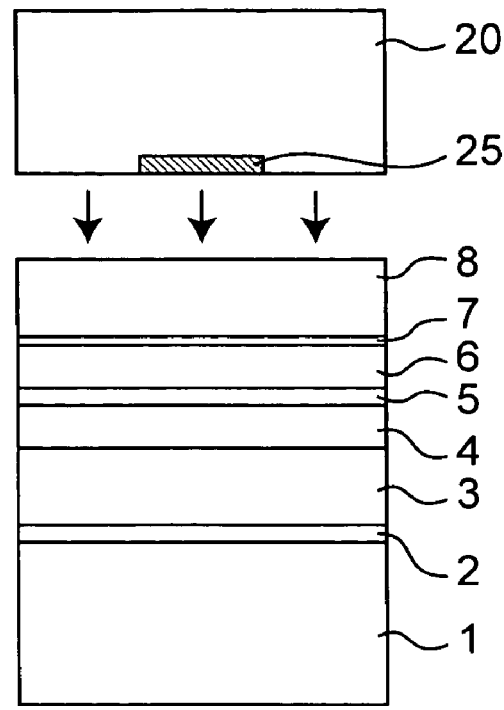
FIG. 7 is a view for showing a step of joining a p-type GaP substrate to an adhesive contact layer.

After that, as shown in FIG. 7, the non-doped GaAs cap layer 9 is removed and the p-type $Ga_{0.915}In_{0.085}P$ adhesive contact layer 8 is polished to put the surface in a mirror-smooth state. The p-type GaP substrate 20 is joined to the surface of the adhesive contact layer 8.

On the joined surface of the p-type GaP substrate 20, Zn is diffused in a circular shape with a diameter of 100 μm to form a Zn diffusion portion 25 with a carrier concentration of $5 \times 10^{18}$ cm$^{-3}$. The Zn diffusion portion 25 is formed on the surface of the p-type GaP substrate 20 at a pitch of 300 μm before being joined.

After that, the surface of the p-type GaP substrate 20 and the surface of the adhesive contact layer 8 are subjected to surface treatment with an etchant to remove an oxide. Then, after cleaning and drying are performed, the p-type GaP substrate 20 is brought into cohesive contact with the adhesive contact layer 8 in a pressed state, and is subjected to heat treatment in vacuo at 750° C. for 0.5 hour. With this, the GaP substrate 20 is joined to the adhesive contact layer 8. Reference numeral 24 denotes a joint surface between the adhesive contact layer 8 and the p-type GaP substrate 20.

In this case, a joint portion between the Zn diffusion portion 25 in the p-type GaP substrate 20 and the adhesive contact layer 8 are in ohmic contact, whereas the other joint portions between the adhesive contact layer 8 and the p-type GaP substrate 20 are not in ohmic contact since the carrier concentration of both the joint portions are low. Therefore, a circular-shaped channel with a diameter of 100 μm is formed from the Zn diffusion portion 25, and current is set to flow only in this portion.

Figure 8:
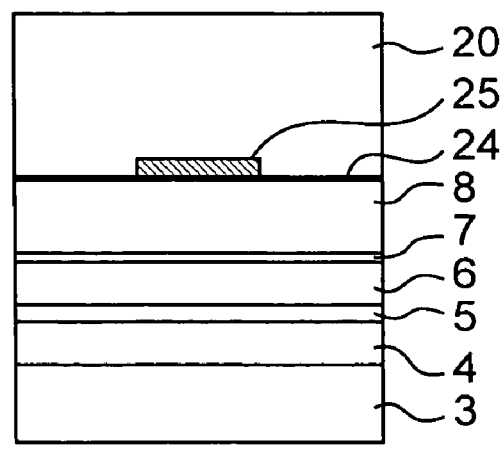
FIG. 8 is a view for showing a state that an n-type GaAs substrate and an n-type GaAs buffer layer are removed after a p-type GaP substrate is joined to the adhesive contact layer.
Figure 9A:
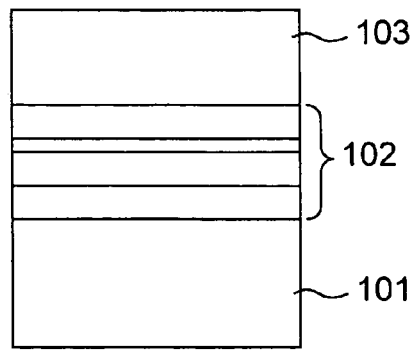
FIG. 9A is a cross sectional view for showing a step in conventional manufacturing method for AlGaInP-based LED.
Figure 9B:
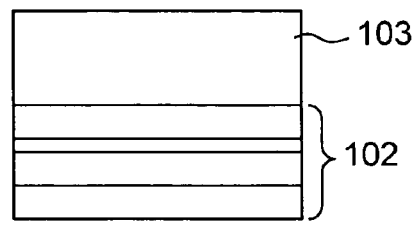
FIG. 9B is a cross sectional view for showing a step in conventional manufacturing method for AlGaInP-based LED, continuously from FIG. 9A.
Figure 9C:
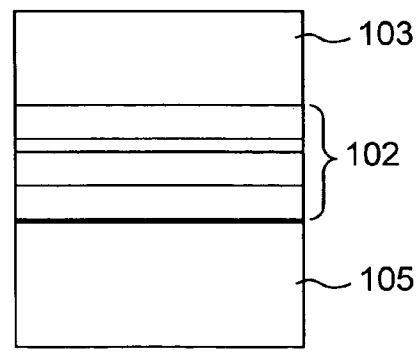
FIG. 9C is a cross sectional view for showing a step in conventional manufacturing method for AlGaInP-based LED, continuously from FIG. 9B.
Figure 9D:
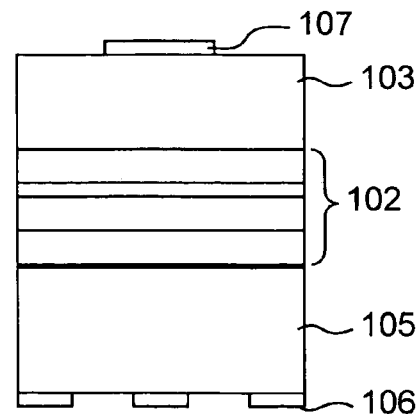
FIG. 9D is a cross sectional view for showing a step in conventional manufacturing method for AlGaInP-based LED, continuously from FIG. 9C.
Figure 10A:
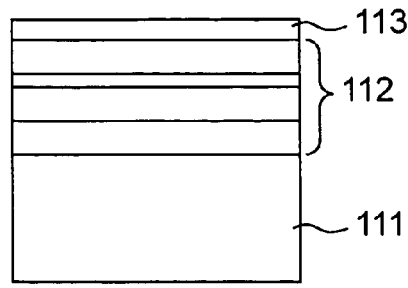
FIG. 10A is a cross sectional view for showing a step in conventional manufacturing method for AlGaInP-based LED.
Figure 10B:
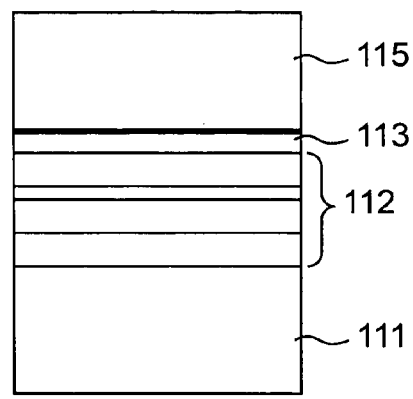
FIG. 10B is a cross sectional view for showing a step in conventional manufacturing method for AlGaInP-based LED, continuously from FIG. 10A.
Figure 10C:
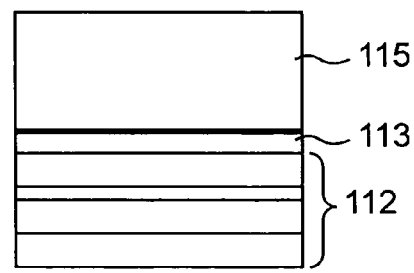
FIG. 10C is a cross sectional view for showing a step in conventional manufacturing method for AlGaInP-based LED, continuously from FIG. 10B.
Figure 10D:
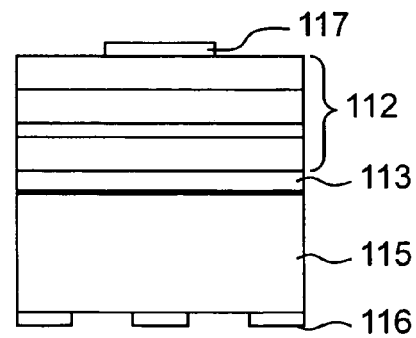
FIG. 10D is a cross sectional view for showing a step in conventional manufacturing method for AlGaInP-based LED, continuously from FIG. 10C.

After that, as shown in FIG. 8, with an ammonium/hydrogen peroxide-based etchant, the n-type GaAs substrate 1 and the n-type GaAs buffer layer 2 are etched away. Then, the surface of the p-type GaP substrate 20 is polished to give the p-type GaP substrate 20 a thickness of 280 μm, and on the polished surface, a bonding pad 11 made of AuBe/Mo/Au with a diameter of 100 μm is formed. The bonding pad 11 is formed on the surface of the p-type GaP substrate 20 with a pitch of 300 μm.

Moreover, on the lower surface of the n-type $Al_{0.5}Ga_{0.5}As$ current diffusion region 3, an n-type electrode 21 with a width of 10 μm made of AuSi is formed. The n-type electrode 21 is formed at a position not overlapped with the Zn diffusion portion 25 in plan view. More particularly, the n-type electrode 21 is formed so as to surround the later-described Al electrode 22 formed at a position almost identical to the Zn diffusion portion 25 in plan view, and is formed in a branch shape in plan view. The n-type electrode 21 is formed so as to come into ohmic contact with the n-type current diffusion layer 3.

Then, the circular-shaped Al electrode 22 with a diameter of 100 μm is formed at a position overlapped with the Zn diffusion portion 25 in plan view. The n-type electrode 21 and the Al electrode 22 are formed so as to overlap with each other and are connected electrically. The Al electrode 22 functions as an electrode for probing (inspection). The Al electrode 22 is formed so as to come into non-ohmic contact with the n-type current diffusion layer 3.

Next, the n-type $Al_{0.5}Ga_{0.5}As$ current diffusion region 3, the n-type $Al_{0.5}In_{0.5}P$ cladding layer 4, the quantum well active layer 5, the p-type $Al_{0.5}In_{0.5}P$ cladding layer 6, the p-type $(Al_{0.2}Ga_{0.8})_{0.77}In_{0.23}P$ intermediate layer 7 are etched up to the p-type $Ga_{0.915}In_{0.085}P$ adhesive contact layer 8 to form an isolation groove as the second groove.

Next, with a V-shaped blade with a blade head portion having an angle of 80° in section, a dicing groove with a depth of 70 μm is formed at a position almost identical to the isolation groove in plan view on the p-type GaP substrate 20. Then, damaged layers by dicing are removed by etching. The surface of the dicing groove formed with the V-shaped blade makes the inclined surface 20a of the p-type GaP substrate. The inclined surface 20a has the following size after dicing into chips. More particularly, the edge between the inclined surface 20a and the parallel surface 20b is approx. 60 μm away from a side surface 20c of the p-type GaP substrate toward the inside in plan view, and the edge between the inclined surface 20a and the side surface 20c is 70 μm away from the parallel surface 20b toward the quantum well active layer 5 in side view.

After that, a characteristic inspection of the LED is executed in the state of a wafer before being diced into chips.

In the first embodiment, the adjacent portions becoming chips are not electrically isolated, and so the characteristic inspection is not available before dicing into respective chips. In the LED of the present embodiment, the portions becoming chips are electrically isolated from each other by the isolation groove, which makes it possible to execute the characteristic inspection before dicing into chips. Therefore, the characteristic inspection is available in the wafer state which is easier to handle than the chip state, which makes it possible to drastically enhance the efficiency of the inspection step.

After the inspection step, with a plate blade with a thickness of 20 μm, the bottom of the V-shaped groove and the isolation groove are connected, by which full dicing is executed. After that, a damaged portion by dicing is etched off.

The LED in the present embodiment has emission wavelength of red color with a peak wavelength of 636 nm. The reflectance of Al to the wavelength is approx. 91%. Therefore, the Al electrode 22 itself functions as a reflection film to light beams with this emission wavelength. Without being limited to Al, the reflection film may be formed from Au, Ag and the like. The reflectance of Au to the wavelength of 636 nm is approx. 96%, and the reflectance of Ag is approx. 98%. In the case of yellow color in the emission wavelength of 580 nm to 590 nm, the reflectance of Au to the light beams is less than 90%, and therefore Al and Ag are desirably used as the reflection film. The reflectance of Al to the light beams in this wavelength band is approx. 91%, and the reflectance of Ag is approx. 98%. Moreover, the reflection film may be the first electrode, and the bonding film and the reflection film may constitute the first electrode.

In the present embodiment, the Al electrode 22 was formed with a diameter of 100 μm. For executing an accurate characteristic inspection, the probe electrode generally needs a diameter of not less than 80 μm, and therefore the characteristic inspection could be executed without problem in the present embodiment.

Thus-obtained semiconductor LED in the second embodiment had an external quantum efficiency of 23%, which was approx. 1.3 times larger than the external quantum efficiency of 18% in the LED in the first embodiment. It is considered that adopting the current narrowing structure by the Zn diffusion portion 25 allowed light emission only in the central portion area of the chip in plan view, thereby achieving increase in outgoing light beams from the inclined surfaces 20a of the p-type GaP substrate 20. Moreover, it is considered that forming the n-type electrode 21 at the position not overlapped with the Zn diffusion portion 25 made it possible to reduce an influence of light absorption occurring in the ohmic connection portion of the n-type electrode 21. Further, it is considered that the Al electrode 22 having a reflectance of not less than 90% to the light beams produced in the quantum well active layer 5 could effectively reflect the light beams toward the p-type GaP substrate 20.

Although in the LED in the present embodiment, the quantum well active layer 5 was made from AlGaInP-based materials, the materials are not limited thereto and so other materials such as AlGaAs-based materials may be used. Moreover, although the GaP substrate 20 was used as the transparent substrate joined to the adhesive contact layer 8, the transparent substrate is not limited thereto, and other semiconductor substrates made from such materials as GaN and SiC may be used as long as the substrates are transparent to emitted light. Further, insulative substrates made from materials such as sapphire and glass which are transparent to emitted light may also be used. In this case, both n-type and p-type electrodes should be formed on the lower surface of the n-type current diffusion layer 3, and be die-bonded with bump. The layer joined to the transparent substrate may be other than the contact layer, e.g., a cladding layer.

Moreover, although in each of the embodiments, description was given of the examples in which the present invention was applied to LEDs, the present invention is applicable to other light emitting devices such as lasers other then the LEDs.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. A semiconductor light emitting device comprising:
    a first conductivity-type first semiconductor layer; an emission layer; a second conductivity-type second semiconductor layer; a second conductivity-type transparent substrate transparent to light beams from the emission layer and directly bonded to the second semiconductor layer which are formed in this order; a first electrode to which a probe is connectable on a surface of the first semiconductor layer opposite to the emission layer, wherein said first electrode is in non-ohmic contact with the first semiconductor layer; and a second electrode which is positioned around the first electrode on a surface of the first semiconductor layer, and which is electrically connected to the first electrode and is in ohmic contact with the first semiconductor layer; and a current narrowing portion formed on the transparent substrate bounding on the second semiconductor layer; wherein the transparent substrate has a parallel surface almost parallel to the emission layer on an opposite side of the emission layer, and an inclined surface adjoining the parallel surface and inclined to the parallel surface and the current narrowing portion defines a light emitting region in the emission layer at a position almost identical to the first electrode in plan view.

2. The semiconductor light emitting device as defined in claim 1, wherein an edge between the inclined surface and the parallel surface is at a distance not less than 20 μm from a side surface of the transparent substrate toward inside in plan view, and an edge between the inclined surface and the side surface of the transparent substrate is at a distance not less than 20 μm from the parallel surface of the transparent substrate toward the emission layer in side view.

3. The semiconductor light emitting device as defined in claim 1, wherein the emission layer has at least one layer formed of $(Al_y Ga_{1-y})_z In_{1-z} P (0 \leq y \leq 1, 0 < z < 1)$.

4. The semiconductor light emitting device as defined in claim 1, wherein the first electrode is circular shaped and has a diameter of not less than 80 μm.

5. The semiconductor light emitting device as defined in claim 1, wherein the second electrode has a branch shape in plan view.

6. The semiconductor light emitting device as defined in claim 1, wherein the first electrode includes a reflection layer having a reflectance of not less than 90% and not more than 100% to light beams produced in the emission layer, and the reflection layer is in contact with the first semiconductor layer.

7. The semiconductor light emitting device as defined in claim 6, wherein the reflection layer contains at least Al, Ag or Au.

* * * * *